(12) United States Patent
Edge

(10) Patent No.: US 6,924,740 B2
(45) Date of Patent: Aug. 2, 2005

(54) ELECTRICAL RESISTANCE MONITORING DEVICE

(75) Inventor: Ian James Edge, Nottingham (GB)

(73) Assignee: Newson Gale Limited, Nottingham (GB)

( * ) Notice: Subject to any disclaimer, the term of this patent is extended or adjusted under 35 U.S.C. 154(b) by 0 days.

(21) Appl. No.: 10/343,351

(22) PCT Filed: Jul. 24, 2001

(86) PCT No.: PCT/GB01/03324

§ 371 (c)(1),
(2), (4) Date: Apr. 25, 2003

(87) PCT Pub. No.: WO02/10781

PCT Pub. Date: Feb. 7, 2002

(65) Prior Publication Data

US 2003/0164770 A1 Sep. 4, 2003

(30) Foreign Application Priority Data

Jul. 29, 2000 (GB) ............................................. 0018586
Feb. 8, 2001 (GB) ............................................. 0103079

(51) Int. Cl.[7] ............................................. G08B 13/08
(52) U.S. Cl. ..................... 340/549; 340/649; 340/650; 340/652
(58) Field of Search ................................. 340/649–657; 407/107; 408/185, 197; 439/459, 460, 726, 759, 95, 96, 504; 324/509, 688, 691

(56) References Cited

U.S. PATENT DOCUMENTS

| | | | |
|---|---|---|---|
| 3,343,154 A | * 9/1967 | Seesselberg | 340/649 |
| 3,641,473 A | * 2/1972 | Attaway | 439/108 |
| 4,558,309 A | * 12/1985 | Antonevich | 340/649 |
| 4,649,374 A | * 3/1987 | Hoigaard | 340/573.1 |
| 4,656,327 A | * 4/1987 | Wilcox | 219/86.21 |
| 4,742,295 A | * 5/1988 | Nahman et al. | 324/133 |
| 4,901,195 A | * 2/1990 | Stemporzewski, Jr. | 361/217 |
| 5,034,726 A | * 7/1991 | Blondin | 340/649 |
| 5,113,303 A | 5/1992 | Herres | 361/49 |
| 5,159,523 A | * 10/1992 | Claassen et al. | 361/215 |
| 5,686,897 A | 11/1997 | Loh | 340/649 |
| 5,772,468 A | * 6/1998 | Kowalski et al. | 439/506 |
| 5,909,181 A | * 6/1999 | Golzmane | 340/649 |

FOREIGN PATENT DOCUMENTS

| | | |
|---|---|---|
| EP | 0 534 702 | 3/1993 |
| GB | 2 342 455 | 4/2000 |

* cited by examiner

Primary Examiner—Daniel Wu
Assistant Examiner—Son Tang
(74) Attorney, Agent, or Firm—Nixon Peabody LLP

(57) ABSTRACT

A device for indicating whether a conductive element has an electrical resistance equal to or less than a predetermined value or whether the conductive element is reliably connected to earth reference potential by a resistance equal to or less than a predetermined value. The device includes a clamp device for connecting the device to the conductive element and which incorporates a battery powered monitoring unit. The monitoring unit includes a current-to-voltage converter with a voltage output that is inversely proportional to the resistance of the conductive element, a comparator which compares at predetermined intervals voltage output to a pre-set reference and determines whether the measured resistance is equal or less than the predetermined value, and a signaling device which is actuated to provide an indication as to whether the measured resistance is equal to or less than the predetermined value.

13 Claims, 4 Drawing Sheets

ELECTRICAL RESISTANCE MONITORING DEVICE

FIELD OF THE INVENTION

This invention relates to an electrical resistance monitoring device, and in particular to a device for indicating whether a conductive element has an electrical resistance equal to or less than a predetermined value or whether the conductive element is reliably connected to earth reference potential by a resistance equal to or less than a predetermined value. The device according to the invention is of particular utility in relation to monitoring the effective earthing or grounding of conductive elements in environments in which build-up of static electricity is undesirable.

BACKGROUND OF THE INVENTION

The speed and scale of modern manufacturing processes, coupled with changes to the nature and properties of many raw materials, have increased the range and number of applications where electrostatic charge can accumulate. Indeed, in any organisation that stores, handles or processes flammable liquids, powders, gases or vapours, there is every likelihood of exposure to the risk of static-caused ignitions within hazardous atmospheres.

It is accepted that each day through Europe, a static related incident causes a serious fire or explosion, whilst in the UK alone statistics suggest that some 50 such incidents occur each year. Apart from business interruption costs resulting from lost product, these incidents may cause serious injury to people and damage to plant and the environment, as well as the possibility of legal action and the attendant bad publicity for the organisation concerned.

In order to combat the build up and unwanted discharge of static electricity, plant and equipment (both fixed and mobile) is generally bonded and grounded (connected to earth), thus dissipating any charge before a dangerous level can be reached.

One measure which is commonly taken to achieve effective grounding is the use of grounding and bonding clamps designed to enable the user to achieve an effective connection to portable/mobile items of plant in order to safely dissipate static electricity. Such clamps commonly comprise spring-loaded jaws by which the clamp can be fastened to the equipment concerned, the clamp being connected to one end of a low-resistance cable, the other end of which is connected to earth.

Obviously, satisfactory operation of grounding clamps and the like depends on satisfactory electrical connection between the jaws of the clamp and the equipment to which it is applied. If the clamp is not properly applied, or if the equipment is coated with insulating material, eg paint or an insulating oxide, such connection may not be achieved. The clamp is then ineffective in discharging any accumulating electrostatic charge and there exists a danger of spark discharge, and the attendant risk of explosion.

Known grounding clamps serve only to connect equipment to a secure earth. They do not provide any monitoring capability to alert a user in the event that the connection to ground is not made, eg due to loose application of the clamp to the equipment or the presence of paint or other insulating covering. Circuit designs which do monitor the quality of a connection to earth are known, but are generally embodied in complex units which are not portable and hence of limited usefulness. Such units may also not be sufficiently protected to be located in hazardous areas.

SUMMARY OF THE INVENTION

There has now been devised a device for reliably monitoring the resistance between the jaws of a grounding clamp and alerting a user of the clamp should that resistance be above an acceptable level, which device overcomes or mitigates the above-mentioned or other disadvantages of the prior art.

According to the invention there is provided a device for indicating whether a conductive element has an electrical resistance equal to or less than a predetermined value or whether the conductive element is reliably connected to earth reference potential by a resistance equal to or less than a predetermined value, said device comprising clamp means for connecting said device to the conductive element;

wherein said clamp means incorporate or are connected to a monitoring unit comprising a current-to-voltage converter with a voltage output proportional to the resistance of the conductive element;

a comparator which determines at predetermined intervals whether said voltage output is equal to or less than a pre-set reference, and hence whether the measured resistance is equal to or less than the predetermined value; and signalling means which are actuated to provide an indication as to whether the measured resistance is equal to or less than the predetermined value.

The device according to the invention is advantageous primarily in that it provides a continuous indication of the resistance of the conductive element, eg to confirm effective connection of the conductive element to earth. Should the resistance rise, eg because the connection to earth is broken, the user is alerted by a change in the signal emitted by the signalling means. Such a change may be that the signalling means is actuated to produce an audible or visual signal, or alternatively that such a signal is switched off. The device may be compact, self-contained and portable, thereby providing greater convenience of use. The device may also be manufactured at lower cost than conventional earth monitoring systems. The device may also have an intrinsically safe design, enabling it to be used in potentially hazardous environments. In particular, the clamp may be designed in such a way that the risk of emission of energy from it (eg by spark discharge) is minimised. To this end all components of the clamp body may be made conductive and cross-bonded so that no part of the clamp body is electrically isolated and capable of accumulating static charge. The number of components (such as capacitors) which are capable of storing energy may also be kept to a minimum.

The clamp means may be generally similar in appearance to a conventional grounding clamp. As such, the clamp may comprise a pair of spring-loaded jaws which are engaged with an available part of the element which is to be earthed.

The jaws of the clamp will contain contacts which are connected to the monitoring unit.

Application of the clamp by means of spring-loaded jaws has the advantage that the clamp may be positioned easily using just one hand, even where the user is wearing protective gloves or other clothing. Other forms of application may, however, be used where appropriate, eg clamping by threaded bolts or the like.

The monitoring unit may be incorporated into the clamp, eg being housed wholly or partly within one of the jaws of the clamp. Alternatively, the monitoring unit may be remote from the clamp. In such a case the monitoring unit may be housed in a remote enclosure, eg a wall-mounted enclosure, to which the clamp is connected by a suitable cable. In such a case, the clamp and associated cable may be permanently connected to the enclosure, eg by virtue of the cable being terminated within the enclosure, or they may be connected to the enclosure by a suitable coupling, eg a releasable coupling.

The predetermined value of the measured resistance which serves as a threshold for the signalling means will generally be in the range 1–100 ohms. Preferably, the value is less than 50 ohms, say 10 ohms or 20 ohms.

The signalling means is most preferably a visual signalling means, though other forms of signalling device (eg audible signals, such as a loudspeaker, buzzer etc) may be used. The preferred visual signalling means is a lamp which is illuminated continuously or intermittently so long as the measured resistance has a value less than the predetermined value. Of course, the lamp may alternatively become illuminated only if the resistance is, or becomes, higher than that value. For reasons of compactness, robustness and low cost, the preferred form of lamp is a light-emitting diode (LED).

It is strongly preferred that the device is provided with its own independent power supply, rather than being connected to a mains supply. This greatly simplifies installation of the device and renders it more portable and versatile. Power for the monitoring unit is thus preferably provided by a battery. The battery is preferably of a type in which it is impossible to discharge all of the energy simultaneously. A particularly preferred form of battery is a lithium manganese battery with a safety non-resettable shut-down mechanism.

Where, as will generally be the case, the tips of the jaws of the clamp carry contacts by which the electrical connection is made between the clamp and the equipment to which it is applied, it is clearly of importance that a good and reliable connection is established. With conventional grounding clamps this is sometimes difficult to achieve, for instance if the surfaces to which the clamp is applied are curved or irregular in shape. It has now been found that this problem can be overcome or substantially mitigated by the provision on the clamp jaws of three point contacts. One of these contacts is provided on one of the clamp jaws and the other two contacts are provided on the other jaw. When the clamp is closed, the two contacts on one jaw preferably lie to either side of the single contact on the other jaw, the three contacts preferably lying substantially in a common plane. Most preferably, the two contacts on one of the jaws make electrical contact with the equipment to which the clamp is applied and are connected to the monitoring unit, the third point contact (on the other jaw) being of insulating material.

BRIEF DESCRIPTION OF THE DRAWINGS

The invention will now be described in greater detail, by way of example only, with reference to the accompanying drawings, in which.

DETAILED DESCRIPTION

Figure 1:
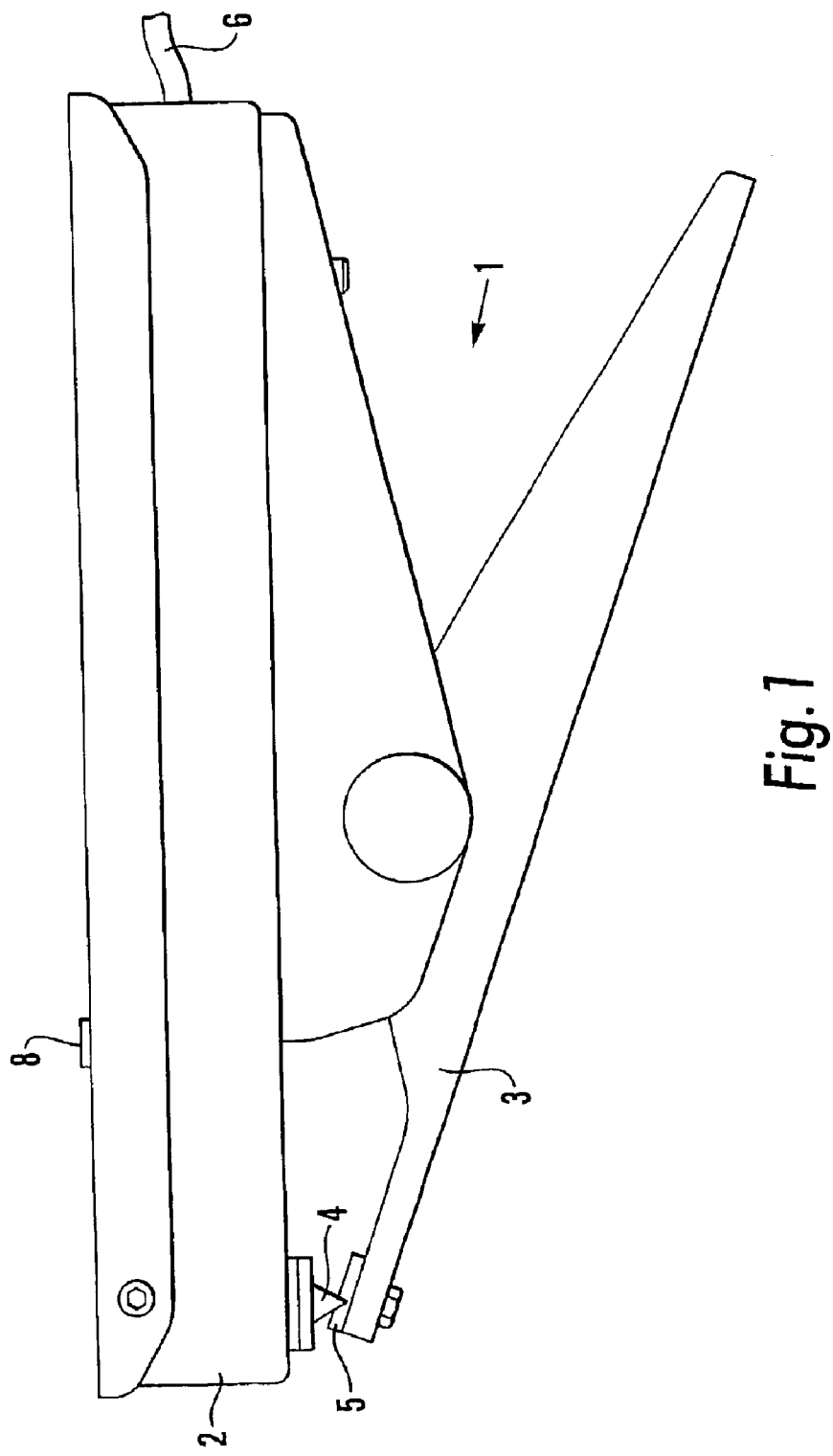
FIG. 1 is a side elevation of a first embodiment of the invention, comprising a grounding clamp incorporating a resistance monitoring device.

Referring first to FIG. 1, a first embodiment of the invention comprises a grounding clamp that is generally designated 1. The clamp 1 comprises, in conventional fashion, a pair of spring-loaded jaws 2,3, the tips of which are fitted with juxtaposed mechanical point contacts 4,5 (described more fully below). A two-core earth cable 6 is connected to the clamp 1. The cable 6 may be in the form of flexible spiral cable or may be wound on a spring-loaded self-retracting cable drum.

The resistance monitoring circuit (described below) is incorporated into the upper jaw 2 of the clamp 1. A light-emitting diode (LED) 8 is mounted in the top surface of the upper jaw 2.

Figure 3:
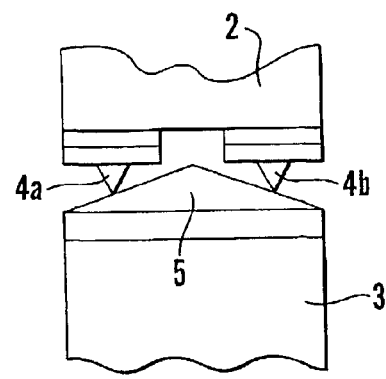
FIG. 3 is a schematic view of a three-point contact arrangement forming part of the clamp of FIG. 1.

The arrangement of the point contacts 4,5 is shown more clearly in FIG. 3. As can be seen, there are a pair of contacts 4a,4b side-by-side on the underside of the upper jaw 2, juxtaposed with a single, central contact 5 on the lower jaw 3. The lower contact 5 is of electrically insulating material and is of elongated form, while the upper contacts 4a,4b are electrically conductive and conical in shape. The three-point mechanical contact between the upper and lower contacts 4a,4b,5 ensures stable and reliable application of the clamp 1, even when the equipment to which the clamp 1 is applied is of irregular shape.

Figure 2:
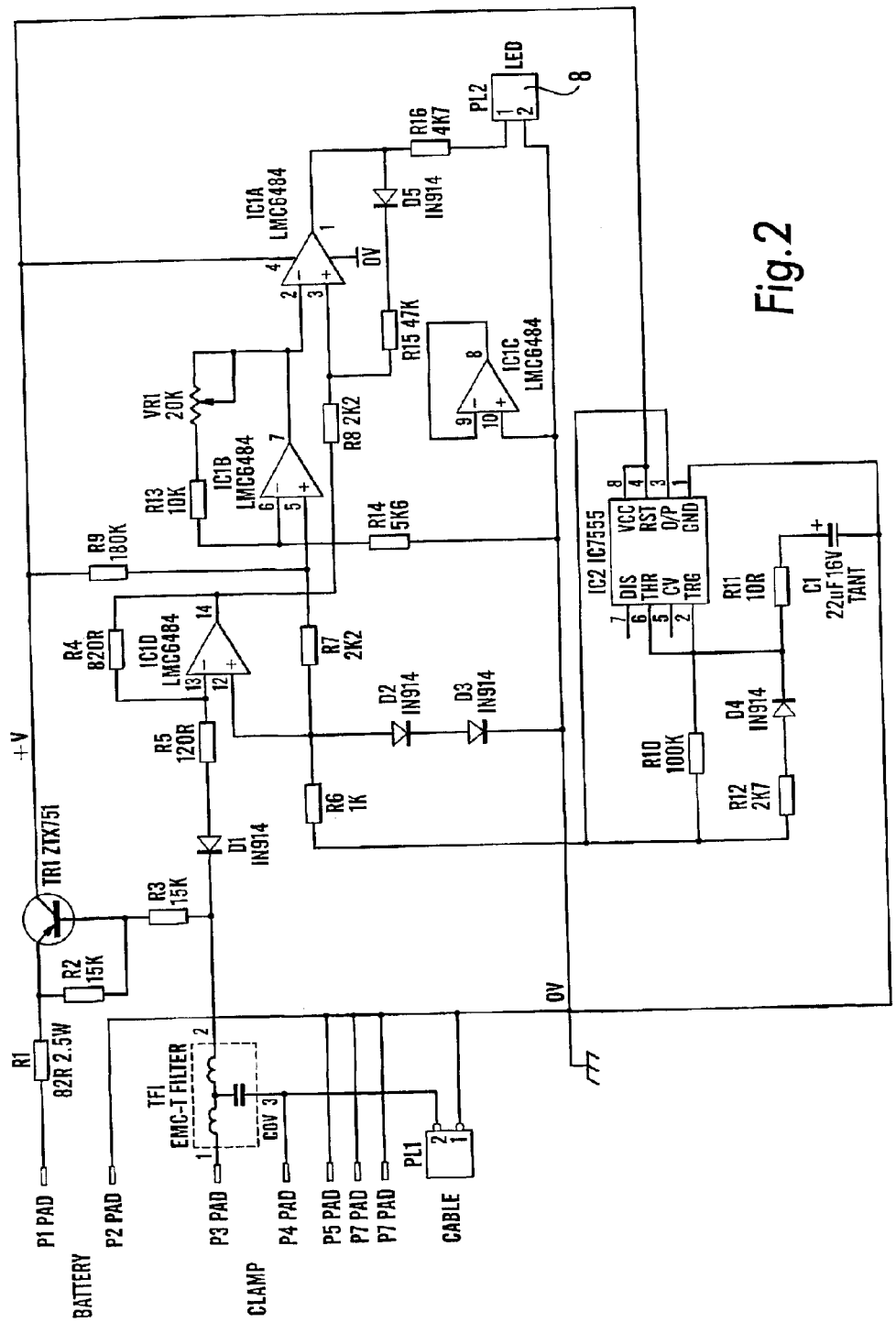
FIG. 2 is a circuit diagram of the resistance monitoring device forming part of the embodiment of FIG. 1.

The circuit diagram of the resistance monitoring circuit is shown in FIG. 2. A 9V lithium manganese battery (not shown) with a safety non-resettable shut-down mechanism is connected across P1 and P2 and the 2-core cable 6 is connected to PL1/1 and PL1/2. The clamp contacts 4,5 are connected to P3 and P4, and the LED 8 is connected to PL2/1 and PL2/2. The circuit includes two integrated circuits: a timer IC2 (type IC 7555) and an operational amplifier IC1 (type LMC6484). Details of these and the other components of the circuit are shown on FIG. 2.

The upper clamp contacts 4a,4b are connected to P3 and P4. Under quiescent conditions the upper clamp contacts 4a,4b are open circuit and transistor TR1 is switched off. In use, the clamp 1 is applied to, for instance, a drum of flammable liquid or a hopper, in the manner of a conventional grounding clamp.

When the clamp contacts 4a,4b are placed across a conductive material, transistor TR1 is switched on and provides voltage to the circuitry. The output from IC2 (pin 3) goes high and remains so for approximately one second. This provides a reference signal of 1.4V to IC1/12 and IC1/5 via R6, D2 & D3. This reference voltage appears on IC1/13 and R4 by negative feedback of IC1/D, the output voltage at the output of IC1/D (pin 14) being $$1.4+(0.7/(R5+Rx))$$

in which Rx is the resistance to be measured.

The pre-set reference is set by the variable resistor VR1 to:

$$1.4(((R13+VR1)/R14)+1)$$

The output of the comparator IC1/A (pin 1) goes high if $$Rx \leq ((R14 \cdot R4)/(2(R13+VR1)))$$

and the LED 8 illuminates.

When the oscillator IC2 changes state the output from the pin 3 goes low and the reference voltage is reduced to zero. The output from IC1/14 is zero and the output from IC1/7 is determined by the ratio of R9 and R7. This gives a small (100 mV) output on IC1/7 and therefore drives the output of the comparator IC1/A low, and the LED 8 therefore turns off.

The oscillator IC2 remains off for a short period until again its output goes high and the measurement cycle recommences. Thus, if Rx is less than the pre-set value the LED 8 pulses on and off. The frequency of pulsing can be varied if required. If Rx is greater than the preset value the LED 8 remains off.

Thus, the clamp 1 (connected to the 2-core cable 6) is applied to the equipment to be grounded in conventional manner. For example, the clamp will be capable of being attached to a metallic vessel to enable the safe dissipation of any static electrical charge on the metallic vessel prior to the commencement of a transfer or mixing operation.

Provided that the electrical connection between the contacts 4a,4b and the equipment is good, and provided also that the connection of the clamp 1 to earth (via the cable 6) is good, the LED 8 blinks. This confirms to the user that the equipment is satisfactorily earthed and that any risk associated with build-up of static electricity on the equipment has been minimised.

The clamp 1 has been described above in a so-called dual-circuit embodiment in which the monitoring unit checks both the connection of the clamp 1 to the equipment to which it is applied and also the connection of the clamp 1 to earth. This requires the use of a two-core cable 6. It is, however, also possible for the clamp 1 to be configured as a single-circuit embodiment utilising a single-core cable. This may be the case, for instance, where an existing single-core cable is in place and the clamp 1 is fitted to it. In such a case, the single core cable is connected to the body of the clamp (being at the pcb 0V level), and a wire link is connected between PL1/1 and PL1/2. It is then just the quality of the connection to the conductive object which is monitored.

Figure 4:
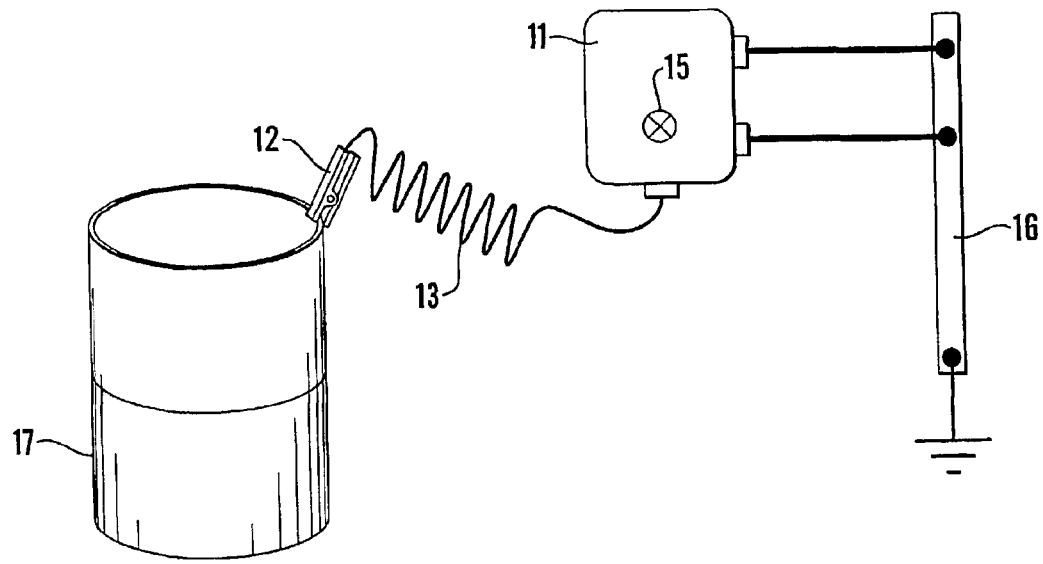
FIG. 4 is a schematic view of a second embodiment of the invention.
Figure 5:
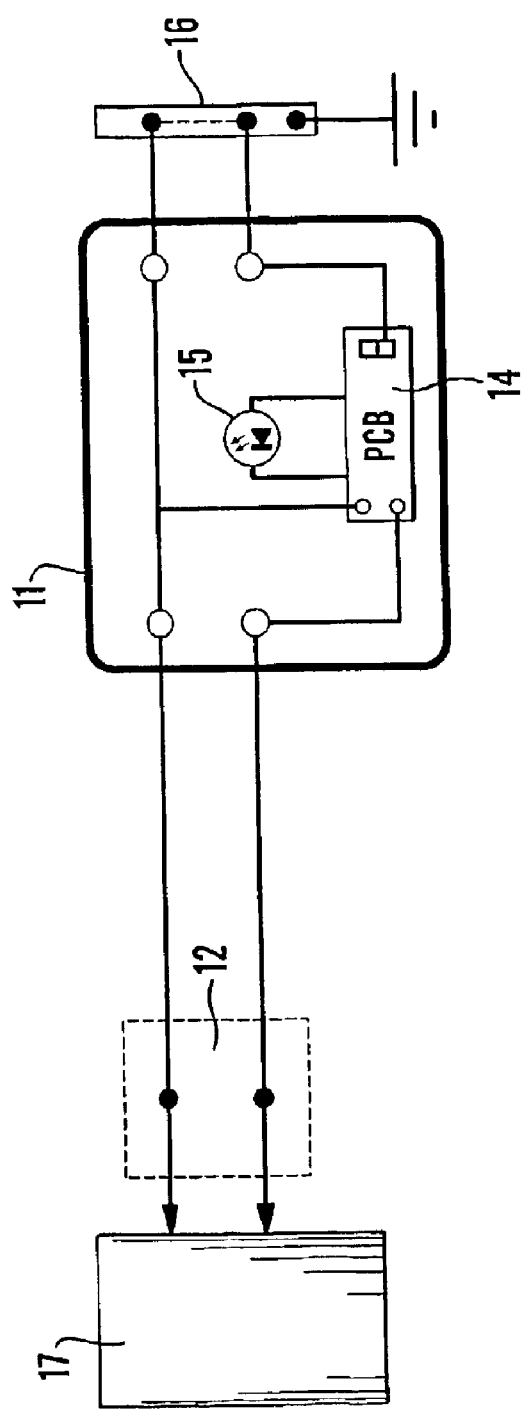
FIG. 5 is a schematic showing in simplified form the circuitry of the second embodiment.

The principle of operation of the second embodiment, illustrated in FIGS. 4 and 5, is generally the same as for the first embodiment. However, the second embodiment differs from the first in that the monitoring unit is housed in an enclosure 11 that is remote from the grounding clamp 12 and is connected to the clamp 12 by a cable 13. Again, the cable 13 may take the form of flexible spiral cable or a cable wound on a spring-loaded self-retracting cable drum.

The monitoring unit comprises a printed circuit board 14 and an LED 15, the LED 15 protruding through the enclosure 11 or being visible through the enclosure 11. The circuit board 14 carries circuitry similar to that described for the first embodiment. The circuit is also connected to static bonding tape 16 of conventional type.

The manner in which the second embodiment is used is essentially the same as for the first embodiment. The clamp 12 is affixed to the equipment that is to be grounded (eg a metal drum 17, as illustrated). Provided that the electrical connection between the clamp 12 and the equipment (in this case, the drum 17) is good, and provided also that the connection of the clamp 12 to earth (via the cable 13, the circuitry in the enclosure 11 and the static bonding tape 16) is good, the LED 15 blinks. This confirms to the user that the equipment is satisfactorily earthed and that any risk associated with build-up of static electricity on the equipment has been minimised.

What is claimed is:

1. A device for indicating whether a conductive element has an electrical resistance equal to or less than a predetermined value or whether the conductive element is reliably connected to earth reference potential by a resistance equal to or less than a predetermined value, said device comprising a clamp device for connecting said device to the conductive element;

wherein said clamp device incorporates a battery powered monitoring unit comprising a current-to-voltage converter with a voltage output that is inversely proportional to the resistance of the conductive element;

a comparator which compares at predetermined intervals said voltage output to a pre-set reference, and determines whether the measured resistance is equal or less than the predetermined value; and a signaling device which is actuated to provide an indication as to whether the measured resistance is equal to or less than the predetermined value, the predetermined value of the measured resistance being in the range 1–100 Ohms.

2. A device as claimed in claim 1, wherein the clamp device comprises a pair of spring-loaded jaws which are engaged with an available part of the conductive element and contain contacts which are connected to the monitoring unit.

3. A device as claimed in claim 1, wherein the predetermined value of the measured resistance is less than 50 Ohms.

4. A device as claimed in claim 1, wherein the signaling device is a visual signaling device.

5. A device as claimed in claim 4, wherein the signaling device is a lamp which is illuminated continuously or intermittently so long as the measured resistance has a value less than the predetermined value.

6. A device as claimed in claim 5, wherein the lamp is a light-emitting diode.

7. A device as claimed in claim 1, wherein the battery is a lithium manganese battery.

8. A device as claimed in claim 1, wherein the clamp device comprises a pair of spring-loaded jaws which are provided with three point contacts, one of said contacts being provided on one of the clamp jaws and the other two contacts on the other jaw.

9. A device as claimed in claim 8, wherein, when the clamp is closed, the two contacts on one jaw lie to either side of the single contact on the other jaw, the three contacts lying substantially in the common plane.

10. A device as claimed in claim 8, wherein the two contacts on one of the jaws make electrical contact with the equipment to which the clamp is applied and are connected to the monitoring unit, a third point contact on the other jaw being of insulating material.

11. A device as claimed in claim 1, wherein the clamp device is connected to earth by a cable.

12. A device as claimed in claim 11, wherein the cable is a two-core cable and the device is adapted to monitor both the connection of the device to the conductive element to which it is applied and also the connection of the device to earth.

13. A device as claimed in claim 11, wherein the cable is a single-core cable and the device is adapted to monitor only the connection of the device to the conductive element to which it is applied.

* * * * *